(12) United States Patent
Usui et al.

(10) Patent No.: US 9,512,359 B2
(45) Date of Patent: Dec. 6, 2016

(54) PHOSPHOR, METHOD FOR PRODUCING PHOSPHOR AND LIGHT EMITTING DEVICE

(71) Applicants: Kabushiki Kaisha Toshiba, Tokyo (JP); Toshiba Materials Co., Ltd., Yokohama-Shi (JP)

(72) Inventors: Daichi Usui, Yokohama (JP); Yasuhiro Shirakawa, Yokohama (JP); Hirofumi Takemura, Kamakura (JP); Tsutomu Ishii, Yokohama (JP)

(73) Assignees: Kabushiki Kaisha Toshiba, Minato-Ku (JP); Toshiba Materials Co., Ltd., Yokohama-Shi (JP)

( * ) Notice: Subject to any disclaimer, the term of this patent is extended or adjusted under 35 U.S.C. 154(b) by 0 days.

(21) Appl. No.: 14/344,087

(22) PCT Filed: Mar. 15, 2013

(86) PCT No.: PCT/JP2013/057405
§ 371 (c)(1),
(2) Date: Mar. 11, 2014

(87) PCT Pub. No.: WO2013/137434
PCT Pub. Date: Sep. 19, 2013

(65) Prior Publication Data
US 2015/0014726 A1 Jan. 15, 2015

(30) Foreign Application Priority Data

Mar. 16, 2012 (JP) .................... 2012-060085

(51) Int. Cl.
*C09K 11/77* (2006.01)
*H01L 33/50* (2010.01)
*C09K 11/08* (2006.01)

(52) U.S. Cl.
CPC ........ *C09K 11/7734* (2013.01); *C09K 11/0883* (2013.01); *H01L 33/502* (2013.01); *Y10T 428/2982* (2015.01)

(58) Field of Classification Search
CPC .... H01L 33/502; H01L 33/50; C09K 11/7706; C09K 11/7734; C09K 11/7731; C09K 11/7728; C09K 11/7774; C09K 11/7792; C09K 11/0883; C09K 11/025; C01P 2004/60; H05B 33/14; H05B 33/20
USPC ........... 252/301.4 F, 301.4 R; 313/502, 503; 428/402
See application file for complete search history.

(56) References Cited

U.S. PATENT DOCUMENTS

| 9,022,591 B2* | 5/2015 | Fukuda .............. C09K 11/0883 362/84 |
| 2005/0230689 A1* | 10/2005 | Setlur ................ C09K 11/7718 257/79 |
| 2009/0096361 A1 | 4/2009 | Fukuda et al. |
| 2010/0025632 A1 | 2/2010 | Fukuda et al. |
| 2010/0102707 A1 | 4/2010 | Fukuda et al. |
| 2010/0237767 A1 | 9/2010 | Emoto et al. |
| 2011/0204769 A1* | 8/2011 | Fukuda ................ C04B 35/597 313/503 |
| 2011/0220919 A1 | 9/2011 | Okada et al. |
| 2011/0309399 A1 | 12/2011 | Shinohara et al. |
| 2012/0119234 A1 | 5/2012 | Shioi et al. |
| 2013/0343059 A1* | 12/2013 | Usui .................. C09K 11/0883 362/293 |

FOREIGN PATENT DOCUMENTS

| CN | 102260500 A | 11/2011 |
| EP | 2 022 835 A1 | 2/2009 |
| EP | 2 368 965 A2 | 9/2011 |
| JP | 2002-194347 A1 | 7/2002 |
| JP | 2006-052337 A1 | 2/2006 |
| JP | 2007-332324 A1 | 12/2007 |
| JP | 2010-031201 A1 | 2/2010 |
| JP | 2010-106127 A1 | 5/2010 |
| JP | 2010-185009 AI | 8/2010 |
| JP | 2011-037913 A1 | 2/2011 |
| JP | 2011-184577 A1 | 9/2011 |
| WO | 2007/105631 A1 | 9/2007 |
| WO | 2010/098141 A1 | 9/2010 |
| WO | 2012/036016 A1 | 3/2012 |
| WO | WO 2012036016 A1 * | 3/2012 ......... C09K 11/0883 |
| WO | 2012/167517 A1 | 12/2012 |

OTHER PUBLICATIONS

Machine translation of WO2012/036016A1, printed Jan. 28, 2016.*
European Search Report, European Application No. 13761307.1, dated Feb. 15, 2015 (5 pages).
International Preliminary Report on Patentability (Application No. PCT/JP2013/057405) dated Sep. 16, 2014.
Chinese Office Action (with EPO Machine Translation), Chinese Application No. 201380003188.9, dated Nov. 25, 2014 (12 pages).
International Search Report dated May 28, 2013.

\* cited by examiner

*Primary Examiner* — Matthew E Hoban
*Assistant Examiner* — Lynne Edmondson
(74) *Attorney, Agent, or Firm* — Burr & Brown, PLLC

(57) ABSTRACT

The present invention provides a phosphor comprising a europium-activated sialon crystal having a basic composition represented by a formula: $(Sr_{1-x}, Eu_x)_\alpha Si_\beta Al_\gamma O_\delta N_\omega$, (1) (wherein x is $0<x<1$, $\alpha$ is $0<\alpha \leq 4$ and $\beta$, $\gamma$, $\delta$ and $\omega$ are numbers such that converted numerical values when $\alpha$ is 3 satisfy $9<\beta \leq 15$, $1 \leq \gamma \leq 5$, $0.5 \leq \delta \leq 3$ and $10 \leq \omega \leq 30$), wherein the phosphor is composed of particles having a sphericity of 0.65 or more and emits green light by being excited by ultraviolet light, violet light or blue light.

4 Claims, 1 Drawing Sheet

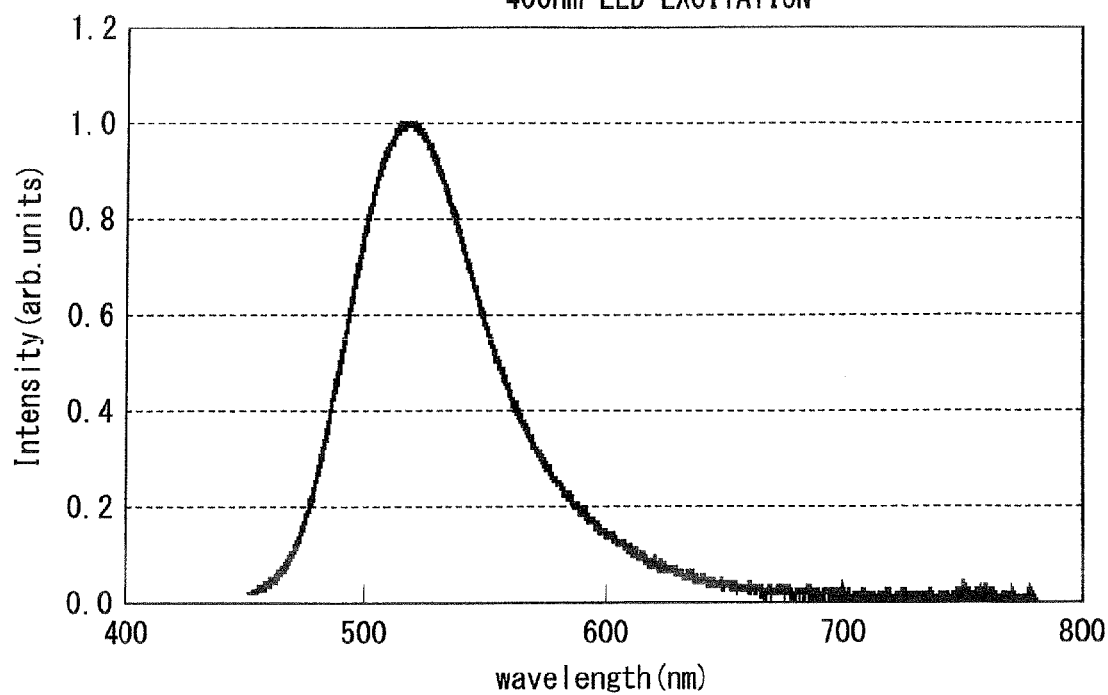

PHOSPHOR, METHOD FOR PRODUCING PHOSPHOR AND LIGHT EMITTING DEVICE

BACKGROUND OF THE INVENTION

Field of the Invention

Embodiments of the present invention relate to a phosphor emitting green light, a method for producing the phosphor and a light emitting device.

Description of Related Art

Phosphor powders are used, for example, for light emitting devices such as light emitting diodes (LEDs). Light emitting devices comprise, for example, a semiconductor light emitting element which is arranged on a substrate and emits light of a pre-determined color, and a light emitting portion containing, in a cured transparent resin, i.e., an encapsulating resin (sealing resin), a phosphor powder which emits visible light by being excited by ultraviolet light or blue light emitted from the semiconductor light emitting element.

Examples of the semiconductor light emitting element used in a light emitting device include GaN, InGaN, AlGaN and InGaAlP or the like. Examples of the phosphor of the phosphor powder used include a blue phosphor, a green phosphor, a yellow phosphor and a red phosphor, which emit blue light, green light, yellow light and red light, respectively, by being excited by the light emitted from the semiconductor light emitting element.

In light emitting devices, the color of the radiation light can be adjusted by including various phosphor powders such as a green phosphor in an encapsulating resin. More specifically, using in combination a semiconductor light emitting element and a phosphor powder which absorbs light emitted from the semiconductor light emitting element and emits light of a predetermined wavelength range causes action between the light emitted from the semiconductor light emitting element and the light emitted from the phosphor powder, and this enables emission of light of a visible light region or white light.

In the past, a phosphor containing strontium and having a europium-activated sialon (Si—Al—O—N) structure (Sr sialon phosphor) has been known.

PRIOR ART DOCUMENTS

Patent Document

Patent Document 1: International Publication No. 2007/105631

SUMMARY OF THE INVENTION

Problems to be Solved by the Invention

Recently, however, a Sr sialon phosphor having higher luminous efficiency has been requested.

The present invention has been made under the above circumstances, and an object thereof is to provide a phosphor having a Sr sialon structure, a method for producing a phosphor and a light emitting device with high luminous efficiency.

Means for Solving the Problems

A phosphor, a method for producing a phosphor and a light emitting device according to the embodiments have been accomplished based on the finding that when a Sr sialon phosphor having a specific composition has a particle shape closer to a sphere, luminance of a light emitting device using the Sr sialon phosphor is increased.

Wadell's sphericity ($\psi$) is known as an index for determining whether a particle shape is close to a sphere or not.

Wadell's sphericity ($\psi$) (sphericity factor) is defined by the following formula (A1) as a ratio of a surface area of a sphere having a same volume as that of an actual particle to a surface area of the actual particle.

[Expression 1]

$$\psi = (\text{A surface area of a sphere having a same volume as that of an actual particle})/(\text{A surface area of an actual particle}) \quad (A1)$$

Generally, in a particle having a certain volume, a surface area of a particle having a spherical shape is the smallest. Therefore, in common particles, Wadell's sphericity ($\psi$) is 1 or less, and it approaches 1 as a particle shape approaches a sphere.

A Sr sialon phosphor generally belongs to a low-symmetrical crystal system known as an orthorhombic system. Therefore, a particle shape of a Sr sialon phosphor has generally been a shape different from a sphere, for example, a shape such as tabular and columnar. The particle shape evaluated by Wadell's sphericity ($\psi$) has been 0.6 or less, which has been a shape quite different from a sphere.

Incidentally, in a light emitting device in which a semiconductor light emitting element and a phosphor are used in combination, light emitted from the semiconductor light emitting element is reflected by a surface of the phosphor or absorbed by the phosphor to cause the phosphor to emit light, and then the light emitted from the phosphor is taken outside while repeating multiple reflection, including reflection by surfaces of other phosphors.

However, when such a phenomenon of light reflection occurs, an energy loss of light will occur. Therefore, according to computer simulation or the like, it has been expected that a sphere having a small surface area will be suitable as a particle shape of a phosphor.

Under such circumstances, the inventors of the present invention have searched for increasing sphericity of the particle shape of a Sr sialon phosphor. As a result, it has been found that when process conditions in producing a phosphor is set to specific conditions, the sphericity of phosphor particles can be increased. Then, it has been also found that a light emitting device using a phosphor having an increased sphericity can significantly improve luminance level.

A phosphor according to the embodiment has been achieved to solve the above problem and comprises a europium-activated sialon crystal having a basic composition represented by the following general formula (1)

[General Formula 1]

$$\text{General formula: } (Sr_{1-x}Eu_x)_\alpha Si_\beta Al_\gamma O_\delta N_\omega \quad (1)$$

(wherein x is 0<x<1, $\alpha$ is 0<$\alpha$≤4 and $\beta$, $\gamma$, $\delta$ and $\omega$ are numbers such that the converted numerical values when $\alpha$ is 3 satisfy 9<$\beta$≤15, 1≤$\gamma$≤5, 0.5≤$\delta$≤3 and 10≤$\omega$≤30), wherein the phosphor includes particles having a sphericity of 0.65 or more and emits green light by being excited by ultraviolet light, violet light or blue light.

Further, a method for producing a phosphor according to the embodiment has been achieved to solve the above problem and comprises a method for producing the above phosphor, comprising: a classification step of removing by classification a small-particle portion in a range of 20% by mass or less of a phosphor powder prepared by baking a mixture of phosphor raw materials that is a raw material of the phosphor, wherein the mixture of phosphor raw materials contains 0.05 to 0.5% by mass of carbon, and the small-particle portion is a portion in which particles of the phosphor powder are integrated sequentially from a particle having a smaller particle size.

Further, a light emitting device according to the embodiment has been achieved to solve the above problem and comprises a substrate, a semiconductor light emitting element which is arranged on the substrate and emits ultraviolet light, violet light or blue light, and a light emitting portion which is formed so as to cover a light emitting surface of the semiconductor light emitting element and contains a phosphor which emits visible light by being excited by light emitted from the semiconductor light emitting element, wherein the phosphor comprises the phosphor defined in any one of claims 1 to 5.

Advantage of the Invention

The phosphor having a Sr sialon structure and the light emitting device of the present invention have high luminous efficiency.

The method for producing a phosphor of the present invention can efficiently produce a phosphor having a Sr sialon structure and a light emitting device with high luminous efficiency.

BRIEF DESCRIPTION OF THE DRAWING

FIG. 1 illustrates an example of an emission spectrum of a light emitting device.

DETAILED DESCRIPTION OF THE INVENTION

A phosphor, a method for producing a phosphor and a light emitting device of the embodiment will be described hereunder. The phosphor of the embodiment is a green phosphor which emits green light by being excited by ultraviolet light, violet light or blue light.
[Green Phosphor]

The green phosphor of the present invention comprises a europium-activated sialon crystal having a basic composition represented by the following general formula (1)

[General Formula 2]

formula: $(Sr_{1-x}Eu_x)_\alpha Si_\beta Al_\gamma O_\delta N_\omega$ (1)

(wherein x is $0<x<1$, $\alpha$ is $0<\alpha \leq 4$ and $\beta$, $\gamma$, $\delta$ and $\omega$ are numbers such that the converted numerical values when $\alpha$ is 3 satisfy $9<\beta \leq 15$, $1 \leq \gamma \leq 5$, $0.5 \leq \delta \leq 3$ and $10 \leq \omega \leq 30$).

Further, the phosphor of the present invention emits green light by being excited by ultraviolet light, violet light or blue light. This green light emitting phosphor is also referred to as a "Sr sialon green phosphor" below. Furthermore, the phosphor of the present invention is composed of particles having a sphericity of 0.65 or more.

Here, the relationship between the europium-activated sialon crystal having a basic composition represented by the general formula (1) and the Sr sialon green phosphor will be described.

The europium-activated sialon crystal having a basic composition represented by the general formula (1) is an orthorhombic single crystal.

On the other hand, the Sr sialon green phosphor is a crystalline body composed of one europium-activated sialon crystal having a basic composition represented by the general formula (1), or an aggregate of crystals in which two or more of the europium-activated sialon crystals are aggregated.

The Sr sialon green phosphor is generally in the form of single crystal powder. This Sr sialon green phosphor powder has an average particle size of generally 1 μm or more and 100 μm or less, preferably 5 μm or more and 80 μm or less, more preferably 8 μm or more and 80 μm or less, and further preferably 8 μm or more and 40 μm or less. Here, the average particle size refers to a measured value by a Coulter counter method, which is the median $D_{50}$ in volume cumulative distribution. Generally, particles of the powder have a tabular (plate) shape or columnar shape which is different from the shape of a sphere.

When the Sr sialon green phosphor is an aggregate of crystals in which two or more of the europium-activated sialon crystals are aggregated, the respective europium-activated sialon crystals can be separated by cracking (pulverizing operation).

In the general formula (1), x is a number that satisfies $0<x<1$, preferably $0.025 \leq x \leq 0.5$, and more preferably $0.25 \leq x \leq 0.5$.

When x is 0, the baked body (sintered body) prepared in the baking step is not a phosphor. When x is 1, the Sr sialon green phosphor has low luminous efficiency.

Also, the smaller the x in the range of $0<x<1$, the more likely the luminous efficiency of the Sr sialon green phosphor is liable to decrease. Further, the larger the x in the range of $0<x<1$, the more likely the concentration quenching occurs due to an excess Eu concentration.

Therefore, in $0<x<1$, x is a number that satisfies preferably $0.025 \leq x \leq 0.5$, and more preferably $0.25 \leq x \leq 0.5$.

In the general formula (1), the comprehensive index of Sr, $(1-x)\alpha$, represents a number that satisfies $0<(1-x)\alpha<4$. Also, the comprehensive index of Eu, $x\alpha$, represents a number that satisfies $0<x\alpha<4$. In other words, in the general formula (1), the comprehensive indices of Sr and Eu represent a number of more than 0 and less than 4, respectively.

In the general formula (1), $\alpha$ represents the total amount of Sr and Eu. By defining the numerical values of $\beta$, $\gamma$, $\delta$ and $\omega$ when the total amount $\alpha$ is a constant value 3, the ratio of $\alpha$, $\beta$, $\gamma$, $\delta$ and $\omega$ in the general formula (1) is clearly determined.

In the general formula (1), each of $\beta$, $\gamma$, $\delta$ and $\omega$ represents a numerical value converted when $\alpha$ is 3.

In the general formula (1), the index of Si, $\beta$, is a number such that the numerical value converted when $\alpha$ is 3 satisfies $9<\beta<15$.

In the general formula (1), the index of Al, $\gamma$, is a number such that the numerical value converted when $\alpha$ is 3 satisfies $1 \leq \gamma \leq 5$.

In the general formula (1), the index of O, $\delta$, is a number such that the numerical value converted when $\alpha$ is 3 satisfies $0.5 \leq \delta \leq 3$.

In the general formula (1), the index of N, $\omega$, is a number such that the numerical value converted when $\alpha$ is 3 satisfies $10 \leq \omega \leq 30$.

When the indices $\beta$, $\gamma$, $\delta$ and $\omega$ in the general formula (1) are out of the respective ranges, there may be a fear that the composition of the phosphor prepared by baking is likely to be different from that of the orthorhombic Sr sialon green phosphor represented by the general formula (1).

The Sr sialon green phosphor of the present invention has a sphericity of 0.65 or more. Here, the sphericity means Wadell's sphericity ($\psi$).

It is preferable that the sphericity be 0.65 or more because luminance level of the Sr sialon green phosphor is high.

The Sr sialon green phosphor represented by the general formula (1) excited by receiving ultraviolet light, violet light or blue light emits green light with an emission peak wavelength of 500 nm or more and 540 nm or less.

The Sr sialon green phosphor is produced, for example, by a method as described below.

[Method for Producing Green Phosphor]

The Sr sialon green phosphor represented by the general formula (1) can be prepared by, for example, preparing a mixture of phosphor raw materials by dry mixing raw materials such as strontium carbonate ($SrCO_3$), aluminum nitride (AlN), silicon nitride ($Si_3N_4$), europium oxide ($Eu_2O_3$) and other oxides, and baking the mixture of phosphor raw materials in nitrogen atmosphere.

The mixture of phosphor raw materials may contain 0.05 to 0.5% by mass of carbon based on 100% by mass of the mixture of phosphor raw materials containing carbon. It is preferable that the mixture of phosphor raw materials contain carbon because sphericity of the green phosphor powder increases.

If the amount of blending of carbon is more than 0.5% by mass, the luminance of a phosphor is likely to be reduced by residual carbon. Carbon is preferably a powder.

The mixture of phosphor raw materials may further contain alkali metal such as potassium fluoride, alkali earth metal fluoride or strontium chloride ($SrCl_2$), each of which is a reaction accelerator, as a flux agent.

A refractory crucible is charged with the mixture of phosphor raw materials. Examples of the refractory crucible used include a boron nitride crucible and a carbon crucible.

The mixture of phosphor raw materials packed in the refractory crucible is baked. A baking apparatus that can maintain predetermined conditions of the composition and the pressure of the baking atmosphere, the baking temperature and the baking time in the inside where the refractory crucible is placed is used. Examples of such a baking apparatus used include an electric oven (electric furnace).

Inert gas is used as the baking atmosphere. Examples of the inert gas used include $N_2$ gas, Ar gas and a mixed gas of $N_2$ and $H_2$.

Generally, when a phosphor powder is prepared by baking a mixture of phosphor raw materials, a phosphor powder of a pre-determined composition is prepared by elimination of an appropriate amount of oxygen O from the mixture of phosphor raw materials containing an excess amount of oxygen O based on the phosphor powder.

$N_2$ in the baking atmosphere has a function of eliminating an appropriate amount of oxygen O from the mixture of phosphor raw materials when a phosphor powder is prepared by baking the mixture of phosphor raw materials.

Also, Ar in the baking atmosphere has a function of preventing excess oxygen O from being supplied to the mixture of phosphor raw materials when a phosphor powder is prepared by baking the mixture of phosphor raw materials.

Also, $H_2$ in the baking atmosphere functions as a reducing agent and eliminates more oxygen O from the mixture of phosphor raw materials than $N_2$ when a phosphor powder is prepared by baking the mixture of phosphor raw materials.

Therefore, when inert gas contains $H_2$, the baking time can be reduced as compared to the case where the inert gas does not contain $H_2$. However, when the content of $H_2$ in inert gas is too high, the resulting phosphor powder is likely to have a composition different from that of the Sr sialon green phosphor represented by the formula (1), and therefore the phosphor powder is likely to have low emission intensity.

When the inert gas is $N_2$ gas or a mixed gas of $N_2$ and $H_2$, the inert gas has a molar ratio of $N_2$ to $H_2$, $N_2H_2$, of generally 10:0 to 1:9, preferably 8:2 to 2:8, and more preferably 6:4 to 4:6.

When the inert gas has a molar ratio of $N_2$ to $H_2$ falling within the above range, i.e., generally 10:0 to 1:9, a high quality single crystal phosphor powder with few defects in the crystal structure can be prepared by short-time baking.

The molar ratio of $N_2$ to $H_2$ in the inert gas can be set at the above ratio, i.e., generally 10:0 to 1:9, by supplying $N_2$ and $H_2$ that are continuously supplied to the chamber of a baking apparatus so that the ratio of the flow rate of $N_2$ to that of $H_2$ is adjusted to the above ratio, and by continuously discharging the mixed gas in the chamber.

It is preferable that the inert gas which is the baking atmosphere be allowed to flow so as to form a stream in the chamber of a baking apparatus because the raw materials can be homogeneously baked.

The inert gas which is the baking atmosphere has a pressure of generally 0.1 MPa (about 1 atm) to 1.0 MPa (about 10 atm), preferably 0.4 MPa to 0.8 MPa.

When the pressure of the baking atmosphere is less than 0.1 MPa, the phosphor powder prepared by baking is likely to have a composition different from that of the Sr sialon green phosphor represented by the formula (1), as compared to the mixture of phosphor raw materials put in a crucible before baking. Therefore, there may be a fear that the phosphor powder is likely to have low emission intensity.

When the pressure of the baking atmosphere is more than 1.0 MPa, the baking conditions are not very different from (hose in the case where the pressure is 1.0 MPa or less, and this results in waste of energy and is not preferable.

The baking temperature is generally set to 1400° C. to 2000° C., preferably 1750° C. to 1950° C., more preferably 1800° C. to 1900° C.

When the baking temperature is in the above range of 1400° C. to 2000° C., a high quality single crystal phosphor powder with few defects in the crystal structure can be prepared by short-time baking.

When the baking temperature is less than 1400° C., it is likely that the color of light emitted from the resulting phosphor powder when excited by ultraviolet light, violet light or blue light is not a desired one. More specifically, it is likely that although the Sr sialon green phosphor represented by the formula (1) is to be prepared, the color of light emitted by excitation by ultraviolet light, violet light or blue light is not green, and becomes another color.

When the baking temperature is more than 2000° C., due to an increased degree of elimination of N and O during baking, the resulting phosphor powder is likely to have a composition different from that of the Sr sialon green phosphor represented by the formula (1). Therefore, the phosphor powder may have low emission intensity.

The baking time is generally 0.5 hour to 20 hours, preferably 1 hour to 10 hours, more preferably 1 hour to 5 hours, further preferably 1.5 hours to 2.5 hours.

When the baking time is less than 0.5 hour or more than 20 hours, the resulting phosphor powder is likely to have a composition different from that of the Sr sialon green phosphor represented by the formula (1). Therefore, the phosphor powder may have low emission intensity.

When the baking temperature is high, the baking time is preferably short, ranging from 0.5 hour to 20 hours. On the other hand, when the baking temperature is low, the baking time is preferably long, ranging from 0.5 hour to 20 hours.

A baked body of a phosphor powder is produced in the refractory crucible after baking. Generally, the baked body is a weakly solidified matter. The baked body is lightly cracked with a pestle or the like to give a phosphor powder. The phosphor powder prepared by cracking is powder of the Sr sialon green phosphor represented by the formula (1).

The particles of the Sr sialon green phosphor prepared through processes as described above have a tabular (plate) or columnar shape different from the shape of a sphere. The present inventors have searched for a method for increasing sphericity of the particle shape of a phosphor and, as a result, have found that oxygen concentration in a baking atmosphere of a phosphor in a composition range represented by the formula (1) greatly influences the particle shape.

More specifically, the present inventors have found that, by baking the Sr sialon green phosphor in a low-oxygen atmosphere, tabular particles of the phosphor are increased in thickness to have a particle shape such as a cylindrical shape which is closer to a sphere. By the baking in a low-oxygen atmosphere, Wadell's sphericity ($\psi$) of the particles of the Sr sialon green phosphor is increased from about 0.4 to 0.5 to about 0.5 to 0.6.

Here, Wadell's sphericity ($\gamma$) has been determined by the following method. First, particle size distribution of a phosphor powder is measured by a Coulter counter method. In the resulting particle size distribution, Ni represents the number frequency of a certain particle size Di. Here, the Coulter counter method is a method of specifying particle size from a voltage change depending on the volume of particles, and the particle size Di represents the diameter of a spherical particle having the same volume as that of an actual particle specified by the voltage change.

The number frequency Ni and particle size Di are used to calculate the specific surface area (S) of a powder phosphor. The specific surface area is the surface area of powder divided by the weight thereof, and is defined as a surface area per unit weight.

Particles having a particle size Di has a weight of $(4\pi/3) \times (Di/2)^3 \times Ni \times \rho$ (here, $\rho$ is the density of powder). The weight of powder is represented by the following formula (A2) in which the weight is summed up for each particle size.

[Expression 2]

$$\Sigma\{(4\pi/3) \times (Di/2)^3 \times Ni \times \rho\} \tag{A2}$$

Particles having a particle size Di have a surface area of $4\pi \times (Di/2)^2 \times Ni$. However, since the actual shape of particles is not a sphere, the actual specific surface area is a value obtained by summing up the surface area divided by Wadell's sphericity ($\psi$), $\{4\pi \times (Di/2)^2 \times Ni\}/\psi$, for each particle size.

Therefore, the specific surface area (S) of a powder phosphor is represented by the following formula (A3).

[Expression 3]

$$S=[\Sigma\{4\pi \times (Di/2)^2 \times Ni\}/\psi]/[\Sigma\{(4\pi/3) \times (Di/2)^3 \times Ni \times \rho\}]=(6/\rho/\gamma) \times \{\Sigma(Di^2 \times Ni)\}/\{\Sigma(Di^3 \times Ni)\} \tag{A3}$$

Actually, Wadell's sphericity ($\psi$) may be a little different for each particle size, which can be interpreted as an average value of deviations from a sphere, as a whole powder.

On the other hand, a flowing-gas technique (such as a Blaine method and a Fisher method) is known as a method for measuring the particle size of powder. In this method, a metal tube with both ends opened is filled with powder, and air is passed through the powder layer, i.e., caused to flow therethrough to specify the particle size from the ease of passing air. This particle size is called a specific surface area diameter (d). The specific surface area diameter (d) and the specific surface area (S) have a relationship of the following formula (A4).

[Expression 4]

$$S=6/\rho/d \tag{A4}$$

Therefore, Wadell's sphericity ($\psi$) can be determined by the following formula (A5) by comparing the specific surface area calculated from the particle size distribution to the specific surface area calculated from the particle size by the flowing-gas technique.

[Expression 5]

$$\psi=d \times \{\Sigma(Di^2 \times Ni)\}/\{\Sigma(Di^3 \times Ni)\} \tag{A5}$$

The particle size in a particle size distribution is generally expressed as a particle size interval. However, in the present invention, a median value in a particle size interval is used as the particle size Di, and each particle size interval has been set to 0.2 µm in order to improve precision. The particle size distribution can be approximated by two straight lines when the distribution is plotted on logarithmico-normal probability paper. Therefore, the number frequency data for every 0.2 µm can be easily obtained from the two normal probability distributions.

Examples of possible methods for baking a phosphor in a low-oxygen atmosphere include a method for baking a phosphor while introducing hydrogen gas. However, a more effective method is a method in which 0.05 to 0.5% by mass or less of carbon powder is mixed during the mixing of raw materials.

Mixing of more than 0.5% by mass of carbon powder will cause a reduction in luminance of a phosphor due to the residual carbon. When the emission wavelength of a phosphor is shifted by a method for baking a phosphor in a low-oxygen atmosphere, the shift can be corrected by adjusting Eu concentration.

When a phosphor is baked in a low-oxygen atmosphere as described above, a phosphor having a high Wadell's sphericity ($\psi$) can be obtained. However, SEM observation of the resulting phosphor has revealed that a phosphor including small particles with a small particle size is more deviated from the shape of a sphere. Thus, in the present invention, the Wadell's sphericity of a phosphor powder is increased to 0.65 or more by performing a classification step of removing these small particles by classification.

(Classification Step)

A classification step is a step of removing by classification a small-particle portion in a range of 20% by mass or less of a phosphor powder prepared by baking a mixture of phosphor raw materials, the small-particle portion being a portion in which particles of the phosphor powder are integrated sequentially from a particle having a smaller particle size.

Examples of classification methods that can be used include a classification method of using a mesh and a classification method of dispersing a phosphor in water, allowing the dispersion to stand, and removing small particles by the difference in settlement due to the particle size. The amount of small particles removed by such classification is 20% by mass or less based on the amount of a phosphor before classification.

Table 1 shows an example of the relationship between the change of sphericity of a phosphor powder and the luminance (relative light emitting luminance) of the light emitting device of the present invention. As a phosphor, a phosphor having a composition of $Sr_{2.7}Eu_{0.3}Si_{13}Al_3O_2N_{21}$ was used.

TABLE 1

| | Manufacturing Conditions | | | Light Emitting |
| --- | --- | --- | --- | --- |
| | Blending Carbon to Phosper Material Mixture (0.1 mass % to Phosphor Material Mixture) | Classification Step (Removing 15 mass % of Smaller-sized Powder from All Phosphor Powder) | Phosphor Powder Sphericity ($\psi$) | Device Relative Light Emission Luminance (%) |
| Conventional Method | No | No | 0.45 | 100 |
| After Baking Phosphor in Low Oxygen Atmosphere | Yes | No | 0.55 | 105 |
| After Classification of Phosphor | Yes | Yes | 0.68 | 110 |

Notes:
"No" means that the carbon-blending or the classification step was not performed.
"Yes" means that the carbon-blending or the classification step was performed.

Table 1 shows a correlation between sphericity and light emission luminance. Thus, it is found that the luminance of a light emitting device can be effectively improved by using the Sr sialon green phosphor of the present invention.

[Light Emitting Device]

The light emitting device uses the Sr sialon green phosphor represented by the general formula (1) described above.

More specifically, the light emitting device comprises: a substrate; a semiconductor light emitting element which is arranged on the substrate and emits ultraviolet light, violet light or blue light; and a light emitting portion which is formed so as to cover a light emitting surface f the semiconductor light emitting element and contains a phosphor which emits visible light by being excited by light emitted from the semiconductor light emitting element, wherein the phosphor comprises the Sr sialon green phosphor represented by the general formula (1). Thereby, the light emitting device emits green light.

Alternatively, if it is designed so that the light emitting portion in the light emitting device contains a blue phosphor and a red phosphor such as a Sr sialon red phosphor having a Sr sialon structure in addition to the Sr sialon green phosphor, there can be provided a white light emitting device which can emit white light from the emitting surface of the light emitting device due to the mixing of colors of light of red, blue and green emitted from the phosphors of the respective colors.

The light emitting device may contain the Sr sialon green phosphor represented by the general formula (1) and the Sr sialon red phosphor as a phosphor. When both of the Sr sialon green phosphor and the Sr sialon red phosphor are present as a phosphor, the resulting light emitting device has good temperature properties.

(Substrate)

Examples of a substrate used include ceramics such as alumina ($Al_2O_3$) and aluminum nitride (AlN) and glass epoxy resin. A substrate of an alumina plate or an aluminum nitride plate is preferred because they have a high thermal conductivity and can control temperature increase in LED light sources.

(Semiconductor Light Emitting Element)

A semiconductor light emitting element is arranged on the substrate.

As the semiconductor light emitting element, a semiconductor light emitting element which emits ultraviolet light, violet light or blue light is used. Here, the ultraviolet light, violet light or blue light means light having a peak wavelength in the wavelength range of ultraviolet, violet or blue light. It is preferable that the ultraviolet light, violet light or blue light have a peak wavelength in the range of 370 nm or more and 470 nm or less.

Examples of the semiconductor light emitting element that emits ultraviolet light, violet light or blue light which are used include ultraviolet light-emitting diodes, violet light-emitting diodes, blue light-emitting diodes, ultraviolet laser diodes, violet laser diodes and blue laser diodes. When a laser diode is used as the semiconductor light emitting element, the peak wavelength described above means a peak oscillation wavelength.

(Light Emitting Portion)

The light emitting portion contains, in a cured transparent resin, a phosphor which emits visible light by being excited by emitted light of ultraviolet light, violet light or blue light from the semiconductor light emitting element. The light emitting portion is formed so as to cover a light emitting surface of the semiconductor light emitting element.

The phosphor used in the light emitting portion comprises at least the Sr sialon green phosphor described above. Alternatively, the phosphor may comprise the Sr sialon red phosphor.

Also, the phosphor used in the light emitting portion may comprise the Sr sialon green phosphor described above, and a phosphor different from the Sr sialon green phosphor. Examples of the phosphor different from the Sr sialon green phosphor which may be used include a red phosphor, a blue phosphor, a green phosphor, a yellow phosphor, a violet phosphor and an orange phosphor. Phosphors in the form of powder are generally used.

In the light emitting portion, the phosphor is present in a cured transparent resin. Generally the phosphor is uniformly dispersed in the cured transparent resin.

The cured transparent resin used for the light emitting portion is a resin prepared by curing a transparent resin, i.e., a resin having high transparency. Examples of transparent resins used may include silicone resins and epoxy resins. Silicone resins are preferred because they have higher UV resistance than epoxy resins. Among the silicone resins, dimethyl silicone resin is more preferred because of their high UV resistance.

It is preferred that the light emitting portion be composed of a cured transparent resin in a proportion of 20 to 1000 parts by mass based on 100 parts by mass of the phosphor. When the proportion of the cured transparent resin with respect to the phosphor is in this range, the light emitting portion has high emission intensity.

The light emitting portion has a film thickness of generally 80 μm or more and 800 μm or less, and preferably 150 μm or more and 600 μm or less. When the light emitting portion has a film thickness of 80 μm or more and 800 μm or less, practical brightness can be secured with a small amount of leakage of ultraviolet light, violet light or blue light from the semiconductor light emitting element. When the light emitting portion has a film thickness of 150 μm or more and 600 μm or less, a brighter light can be emitted from the light emitting portion.

The light emitting portion is prepared by, for example, first mixing a transparent resin and a phosphor to prepare a phosphor slurry in which the phosphor is dispersed in the transparent resin, and then applying the phosphor slurry to a semiconductor light emitting element or to the inner surface of a globe, and curing.

When the phosphor slurry is applied to the semiconductor light emitting element, the light emitting portion covers the semiconductor light emitting element with being in contact therewith. When the phosphor slurry is applied to the inner surface of the globe, the light emitting portion is remote from the semiconductor light emitting element and formed on the inner surface of the globe. The light emitting device in which the light emitting portion is formed in the inner surface of the globe is called a remote phosphor-type LED light emitting device.

The phosphor slurry may be cured by being heated at, for example, 100° C. to 160° C., FIG. 1 illustrates an example of an emission spectrum of a light emitting device.

More specifically, FIG. 1 illustrates an emission spectrum of a green light emitting device at 25° C., in which a violet LED which emits violet light having a peak wavelength of 400 nm is used as a semiconductor light emitting element and only a Sr sialon green phosphor having a basic composition represented by $Sr_{2.7}Eu_{0.3}Si_{13}Al_3O_2N_{21}$ is used as a phosphor.

The violet LED has a forward voltage drop Vf of 3.199 V and a forward current If of 20 mA.

As shown in FIG. 1, the green light emitting device using the Sr sialon green phosphor represented by the general formula (1) as a phosphor has high emission intensity even if a short-wavelength excitation light such as violet light or the like is used.

DESCRIPTION OF EMBODIMENTS

Embodiments of the present invention will be shown below with reference to the following Examples, but the present invention should not be construed as being limited thereto.

Example 1

Preparation of Green Phosphor

First, 337 g of $SrCO_3$, 104 g of AlN, 514 g of $Si_3N_4$, 44 g of $Eu_2O_3$ and 1 g of carbon powder were precisely weighed and an appropriate amount of a flux agent was added thereto, and the mixture was dry-mixed to prepare a mixture of phosphor raw materials. Thereafter, a boron nitride, crucible was charged with the mixture of phosphor raw materials.

The boron nitride crucible charged with the mixture of phosphor raw materials was baked in an electric furnace in a nitrogen atmosphere of 0.7 MPa (about 7 atm) at 1850° C. for 2 hours. As a result, a solidified baked powder was prepared in the crucible.

The solid was cracked and 10 times its mass of pure water was added to the baked powder, and the mixture was stirred for 10 minutes and filtered to prepare a baked powder. The procedure of washing the baked powder was repeated another 4 times to carry out washing for 5 times in total.

<Classification Step>

Next, the classification step was performed by adding 10 times its mass of pure water to the washed baked powder in the same manner as in washing, stirring the mixture for 10 minutes, stopping the stirring, allowing the resulting mixture to stand for a predetermined period of time, and then discharging a supernatant together with a phosphor having small particles. The operation of classification was repeated 3 times. The baked powder after classification was filtered and dried, and sieved through a nylon mesh with an aperture of 45 microns, thereby to prepare the baked powder of the present invention.

The baked powder was analyzed and found to be a single crystal Sr sialon green phosphor having the composition shown in Table 2.

TABLE 2

|  | Phosphor Material Mixture Preparing Step Blending Ratio of Carbon in Phosphor Material Mixture (mass %) | Basic Composition of Baked Powder | Classification Step Removing Ratio of Small-Sized Grain (mass %) | Sphericity (ψ) | Relative Light Emission Luminance (%) |
|---|---|---|---|---|---|
| Example 1 | 0.1 | $Sr_{2.7}Eu_{0.3}Si_{13}Al_3O_2N_{21}$ | 15 | 0.68 | 110 |
| Comparative Example 1 | — | $Sr_{2.7}Eu_{0.3}Si_{13}Al_3O_2N_{21}$ | — | 0.46 | 100 |
| Example 2 | 0.06 | $Sr_{2.5}Eu_{0.5}Si_{11}Al_{2.8}O_{0.7}N_{19}$ | 18 | 0.7 | 111 |
| Comparative Example 2 | — | $Sr_{2.5}Eu_{0.5}Si_{11}Al_{2.8}O_{0.7}N_{19}$ | — | 0.52 | 100 |
| Example 3 | 0.12 | $Sr_{2.3}Eu_{0.7}Si_{10.5}Al_3O_{0.6}N_{18.6}$ | 15 | 0.69 | 109 |
| Comparative Example 3 | — | $Sr_{2.3}Eu_{0.7}Si_{10.5}Al_3O_{0.6}N_{18.6}$ | — | 0.49 | 100 |
| Example 4 | 0.16 | $Sr_{2.5}Eu_{0.5}Si_{15}Al_{2.8}O_{1.2}N_{24}$ | 16 | 0.68 | 108 |

TABLE 2-continued

| | Phospher Material Mixture Preparing Step Blending Ratio of Carbon in Phosphor Material Mixture (mass %) | Basic Composition of Baked Powder | Classification Step Removing Ratio of Small-Sized Grain (mass %) | Sphericity ($\psi$) | Relative Light Emission Luminance (%) |
|---|---|---|---|---|---|
| Comparative Example 4 | — | $Sr_{2.5}Eu_{0.5}Si_{15}Al_{2.8}O_{1.2}N_{24}$ | — | 0.53 | 100 |
| Example 5 | 0.11 | $Sr_{2.3}Eu_{0.7}Si_{11}Al_3ON_{19}$ | 17 | 0.71 | 108 |
| Comparative Example 5 | — | $Sr_{2.3}Eu_{0.7}Si_{11}Al_3ON_{19}$ | — | 0.55 | 100 |
| Example 6 | 0.15 | $Sr_{2.8}Eu_{0.2}Si_{11.6}Al_{3.2}ON_{20}$ | 13 | 0.66 | 110 |
| Comparative Example 6 | — | $Sr_{2.8}Eu_{0.2}Si_{11.6}Al_{3.2}ON_{20}$ | — | 0.48 | 100 |
| Example 7 | 0.2 | $Sr_{2.9}Eu_{0.1}Si_{14}Al_{4.5}O_{1.6}N_{24.1}$ | 18 | 0.69 | 112 |
| Comparative Example 7 | — | $Sr_{2.9}Eu_{0.1}Si_{14}Al_{4.5}O_{1.6}N_{24.1}$ | — | 0.42 | 100 |
| Example 8 | 0.17 | $Sr_{2.6}Eu_{0.4}Si_{10}Al_2O_{0.5}N_{17}$ | 15 | 0.69 | 109 |
| Comparative Example 8 | — | $Sr_{2.6}Eu_{0.4}Si_{10}Al_2O_{0.5}N_{17}$ | — | 0.5 | 100 |
| Example 9 | 0.23 | $Sr_{2.7}Eu_{0.3}Si_{9.5}AlON_{15}$ | 14 | 0.67 | 110 |
| Comparative Example 9 | — | $Sr_{2.7}Eu_{0.3}Si_{9.5}AlON_{15}$ | — | 0.47 | 100 |
| Example 10 | 0.08 | $Sr_{2.8}Eu_{0.2}Si_{15}Al_5O_{1.5}N_{26}$ | 18 | 0.71 | 109 |
| Comparative Example 10 | — | $Sr_{2.8}Eu_{0.2}Si_{15}Al_5O_{1.5}N_{26}$ | — | 0.53 | 100 |

(Preparation of Light Emitting Device)

A light emitting device was prepared using the resulting Sr sialon green phosphor.

(Evaluation of Green Phosphor and Light Emitting Device)

Sphericity was measured for the resulting Sr sialon green phosphor, and the luminous efficiency of the light emitting device using the Sr sialon green phosphor was measured. The luminous efficiency was measured at room temperature (25° C.) and expressed as a relative value (%) with the luminous efficiency (lm/W) at room temperature in Comparative Example 1 described later as 100.

Comparative Example 1 is a phosphor prepared in the same manner as in Example 1 except for not blending carbon powder with a mixture of phosphor raw materials and not performing the classification step.

The measurement results of sphericity and luminous efficiency are shown in Table 2.

Comparative Example 1

A phosphor was prepared in the same manner as in Example 1 except for not blending carbon powder with a mixture of phosphor raw materials and not performing the classification step.

Sphericity was measured for the resulting green phosphor, and the luminous efficiency of a light emitting device using the green phosphor was measured, all in the same manner as in Example 1. The measurement results of sphericity and luminous efficiency are shown in Table 2.

Examples 2 to 10 and Comparative Examples 2 to 10

Preparation of Green Phosphor

Green phosphors were prepared in the same manner as in Example 1 except for changing the amount of blending of carbon powder in a mixture of phosphor raw materials as shown in Table 2 to prepare a baked powder having a basic composition shown in Table 2 and performing the classification step of the baked powder as shown in Table 2 (Examples 2 to 10).

Phosphors were prepared in the same manner as in Examples 2 to 10 except for not blending carbon powder with a mixture of phosphor raw materials and not performing the classification step (Comparative Examples 2 to 10).

Sphericity was measured for the resulting green phosphors (Examples 2 to 10 and Comparative Examples 2 to 10), and the luminous efficiency of light emitting devices using these green phosphors was measured, all in the same manner as in Example 1. The measurement results of sphericity and luminous efficiency are shown in Table 2.

In this regard, the luminous efficiency of light emitting devices in Examples 2 to 10 was expressed as a relative value (%) with the luminous efficiency (lm/W) of light emitting devices in Comparative Examples prepared in the same manner as in corresponding Examples, except for not blending carbon powder with a mixture of phosphor raw materials and not performing the classification step, as 100.

More specifically, the luminous efficiency of light emitting devices in Examples 2 to 10 was expressed as a relative value (%) with the luminous efficiency (lm/W) of light emitting devices in Comparative Examples 2 to 10, respectively, as 100.

The result shown in Table 2 reveals that a phosphor in which sphericity is increased by the process of the present invention and a light emitting device using the phosphor have improved luminous efficiency as compared to conventional phosphors and light emitting devices using conventional phosphors.

Note that although several embodiments of the present invention have been described, these embodiments are presented as examples only and are not intended to limit the scope of the present invention. These new embodiments can be performed in other various modes, and various omissions, substitutions and changes can be made without departing from the spirit of the present invention. These embodiments and modifications thereof are included in the scope and spirit of the present invention and included in the inventions described in the claims and the scope of equivalents thereof.

The invention claimed is:

1. A phosphor comprising a europium-activated sialon crystal having a basic composition represented by the following formula:

$(Sr_{1-x},Eu_x)_\alpha Si_\beta Al_\gamma O_\delta N_\omega$, wherein x is $0<x<1$, $\alpha$ is 3, and $\beta$, $\gamma$, $\delta$ and $\omega$ satisfy $9<\beta\leq 15$, $1\leq\gamma\leq 5$, $0.5\leq\delta\leq 3$ and $10\leq\omega\leq 30$, wherein the phosphor belongs to an orthorhombic system, has an emission peak wavelength of 500 nm or more and 540 nm or less, is composed of particles having a Wadell's sphericity of from 0.65 to 0.71, and emits green light by being excited by ultraviolet light, violet light or blue light, and wherein the phosphor has an average particle size of from 8 to 40 μm.

2. A method for producing a phosphor according to claim 1, comprising:

a preparing step of preparing a mixture of phosphor raw materials containing 0.05 to 0.5% by mass of carbon;

a baking step of baking the mixture of phosphor raw materials in an inert gas atmosphere having a pressure of 0.1 to 1.0 MPa; and a classification step of removing by classification a small-particle portion in a range of 20% by mass or less of a phosphor powder prepared by baking the mixture of phosphor raw materials.

3. A light emitting device comprising:

a substrate, a semiconductor light emitting element which is arranged on the substrate and emits ultraviolet light, violet light or blue light, and a light emitting portion which is formed so as to cover a light emitting surface of the semiconductor light emitting element and contains a phosphor which emits visible light by being excited by light emitted from the semiconductor light emitting element, wherein the phosphor comprises a phosphor according to claim 1, and the light emitting portion has a thickness of 150 μm or more and 600 μm or less.

4. The light emitting device according to claim 3, wherein the semiconductor light emitting element is a light-emitting diode or a laser diode which emits light having a peak wavelength in a range of 370 nm or more and 470 nm or less.

* * * * *